United States Patent
Jayaraman et al.

(10) Patent No.: US 7,314,778 B2
(45) Date of Patent: Jan. 1, 2008

(54) WAFER-LEVEL PROCESSING OF CHIP-PACKAGING COMPOSITIONS INCLUDING BIS-MALEIMIDES

(75) Inventors: Saikumar Jayaraman, Chandler, AZ (US); Stephen E. Lehman, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 74 days.

(21) Appl. No.: 11/323,300

(22) Filed: Dec. 30, 2005

(65) Prior Publication Data

US 2007/0155047 A1    Jul. 5, 2007

(51) Int. Cl.
    *H01L 21/44*    (2006.01)
    *H01L 21/48*    (2006.01)
    *H01L 21/50*    (2006.01)

(52) U.S. Cl. .............. 438/106; 438/112; 438/124; 257/E21.502; 257/E21.503

(58) Field of Classification Search ......... 438/106, 438/107, 108, 112, 118, 119, 124
See application file for complete search history.

(56) References Cited

U.S. PATENT DOCUMENTS

| | | | | |
|---|---|---|---|---|
| 5,319,244 A | * | 6/1994 | Papathomas et al. | 257/701 |
| 5,847,327 A | * | 12/1998 | Fischer et al. | 174/258 |
| 6,046,060 A | * | 4/2000 | Budnaitis | 438/10 |
| 6,344,371 B2 | * | 2/2002 | Fischer et al. | 438/106 |
| 6,555,412 B1 | * | 4/2003 | Wensel | 438/106 |
| 2007/0090532 A1 | * | 4/2007 | Lehman | 257/777 |
| 2007/0152311 A1 | | 7/2007 | Jayaraman et al. | |

OTHER PUBLICATIONS

Jayaraman, S., et al., "Chip-Packaging Compositions, Including Bis-Maleimides, Packages Made Therewith, and Methods of Assembling Same", *U.S. Appl. No. 11/323,475, filed Dec. 30, 2005*), 52 pgs.

Vo, H. T., "Towards Model-Based Engineering of Underfill Materials: CTE Modeling", *Microelectronics Journal*, 32(4), (Apr. 1, 2001), 331-338.

\* cited by examiner

*Primary Examiner*—Daivd Nhu
(74) *Attorney, Agent, or Firm*—Schwegman, Lundberg & Woessner, P.A.

(57) ABSTRACT

A process of packaging a microelectronic chip includes wafer-level application of a chip-packaging composition that includes a polymer of a bis-maleimide. A process includes wafer-level addition of the chip-packaging compositions that include adding particulate fillers to achieve a coefficient of thermal expansion of about 20 ppm/K. A computing system is also included that uses a microelectronic die that was processed with the bis-maleimide at the wafer level, before singulation.

26 Claims, 5 Drawing Sheets

WAFER-LEVEL PROCESSING OF CHIP-PACKAGING COMPOSITIONS INCLUDING BIS-MALEIMIDES

RELATED APPLICATIONS

This application is co-pending with U.S. patent application Ser. No. 11/323,475, filed on Dec. 30, 2005.

TECHNICAL FIELD

Disclosed embodiments relate to chip-packaging compositions for microelectronic packages assembled therewith.

BACKGROUND INFORMATION

Epoxy-based compositions are used frequently for encapsulation of microelectronic devices as well as for chip-and-board underfill processes, among others. Encapsulation is employed to protect components of electronic devices from environmental and thermomechanical stresses. Flip-chip technology employs underfill to reinforce solder joints by filling the space between the flip-chip die and the mounting substrate.

An encapsulant composition is applied to an electronic part to completely cover and protect the sensitive components such as the die, wire bonds, and capacitors. Encapsulants can be applied to the electronic devices by one of several methods including resin transfer molding, cavity filling dispense, dam and fill dispense, and stencil printing, resin film infusion, and liquid molding.

A "capillary underfill" process typically proceeds by first aligning the solder bumps on a flip-chip with the pads on a substrate, and the solder is reflowed to form the solder joints. After forming the solder joints, the underfill composition is flowed between the flip-chip and the mounting substrate. Thereafter, the underfill composition is cured. Capillary underfilling can be assisted by pumping the underfill composition between the flip-chip and the mounting substrate, or by vacuum-assisted drawing the underfill composition between the flip-chip and the mounting substrate.

The "no-flow" underfill process is another method of underfilling a flip-chip device. In a no-flow underfill process, the underfill composition is dispensed on the mounting substrate or the flip-chip, and the flip-chip and the mounting substrate are brought into contact. The solder bumps that are on the chip are aligned with the pads on the substrate. Next, the underfill composition is cured prior to or substantially simultaneously with reflowing the solder bumps to create the solder joints.

A die-attach material is used to connect a die to a heat sink, substrate, or another die. The die-attach material provides both adhesive and heat-transfer qualities between the die and the heat sink. Because of disparate materials between die, die-attach material, and heat sink, thermal stresses are present during heated operation of the die.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Embodiments relate to resins for chip-packaging compositions that have a low coefficient of thermal expansion (CTE). The chip-packaging composition embodiments can be employed as underfill materials, both first-level and second level, and also as capillary underfills and no-flow underfills. The chip-packaging composition embodiments can be employed as molding compounds. The chip-packaging composition embodiments can be employed as encapsulants. The chip-packaging composition embodiments can be employed as thermal-interface materials (TIMs). The chip-packaging composition embodiments can be employed as die-attach adhesives. Hereinafter, the particular underfills, molding compounds, encapsulants, TIMs, and die-attach adhesives will be referred to as chip-packaging composition embodiments unless explicitly referred to otherwise. Unless expressly defined as such, "chip-packaging mixtures" and "chip-packaging compositions" can be used interchangeably. By all proportions set forth in this disclosure as percentages or ratios, these proportions are understood to be weight proportions unless expressed otherwise. Similarly by these expressed proportions, the amounts relate to pre-mixture and pre-composite amounts before solution, reaction, and mixture products are arrived at.

The following description includes terms, such as upper, lower, first, second, etc., that are used for descriptive purposes only and are not to be construed as limiting. The embodiments of a device or article described herein can be manufactured, used, or shipped in a number of positions and orientations.

The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be upon the board surface. As depicted in this disclosure, a bond pad is not limited to being flush or being upon the surface only because it is illustrated as such, unless it is explicitly stated in the text.

A "solder bump" or "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used, such as a pin in a pin-grid array.

The effectiveness of a chip-packaging composition depends on its chemical, physical, and mechanical properties. Properties that make a chip-packaging composition embodiment desirable include low coefficient of thermal expansion (CTE), low moisture uptake, high adhesion, high toughness, high glass transition (Tg) temperature, high heat distortion temperature, and others. The chip-packaging composition can include particulate filler inorganics such as silica or the like, and metal flakes or the like. The particulate filler increases the modulus and reduces the CTE of the chip-packaging composite, in order to better match the CTE of silicon and the glass fiber composite substrate material. An example of a silica-filled chip-packaging composition is silica-filled bis-maleimide.

Figure 1:
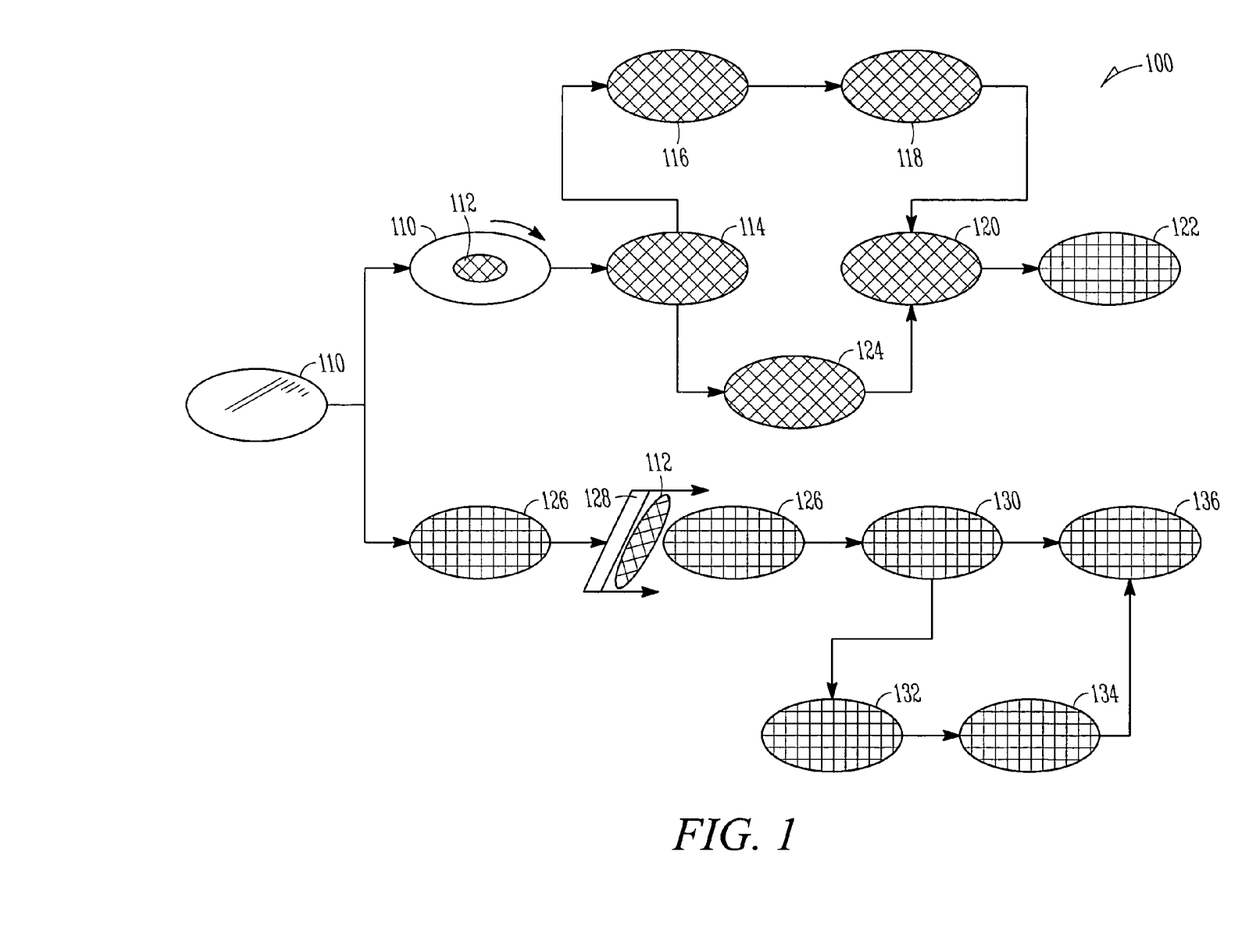
FIG. 1 is a schematic process flow diagram according to an embodiment.

FIG. 1 is a schematic process flow diagram 100 according to an embodiment. The process commences with a bumped wafer 110 that is prepared for further processing. In an embodiment, the bumped wafer 110 is spin coated to achieve a spin-coated wafer 114. The spin coating 112 includes any coating that is a chip-packaging composition embodiment set forth in this disclosure.

In an embodiment, the spin-coated wafer 114 is masked by masking the bumps to achieve a bump-masked wafer 116. Thereafter, the mask is treated to harden the unmasked areas, and a bump-exposed, coated, etched wafer 118 results. Thereafter, the bump-exposed, coated, etched wafer 118 is cured to achieve a coated, cured wafer 120. In an embodiment, curing the chip-packaging composition is carried out in a temperature range from about 100° C. to about 300° C. Following the cure, the coated, cured wafer 120 is diced to achieve a coated, cured, diced wafer 122.

In an embodiment, the spin-coated wafer 114 is polished to remove coating 112 down to the level of the bumps to achieve a coated, polished wafer 124. Thereafter, the coated, polished wafer 124 is cured to achieve a coated, cured wafer 120. Following the cure, the coated, cured wafer 120 is diced to achieve a coated, cured, diced wafer 122.

In an embodiment, the bumped wafer 110 is first diced to achieve a diced wafer 126. Thereafter, the diced wafer 126 is treated with a chip-packaging composition 112 by a method such as application to the diced wafer 126 with a squeegee 128 to achieve a diced, coated wafer 130. Thereafter, the diced, coated wafer 130 is further processed to achieve a solvent bake to remove volatiles not needed in the final article to achieve a baked wafer 132. Thereafter according to an embodiment, a partial cure is carried out to achieve a partially cured wafer 134. In an embodiment, solvent baking and partial curing are not required, in which event, the coated wafer 130 is cured to achieve a cured wafer 136.

According to the embodiments depicted in FIG. 1, processing of the chip-packaging composition embodiments is carried out at the wafer level, or at the diced, but not dispersed level of a wafer as depicted for example at 122 or at 136.

Figure 2:
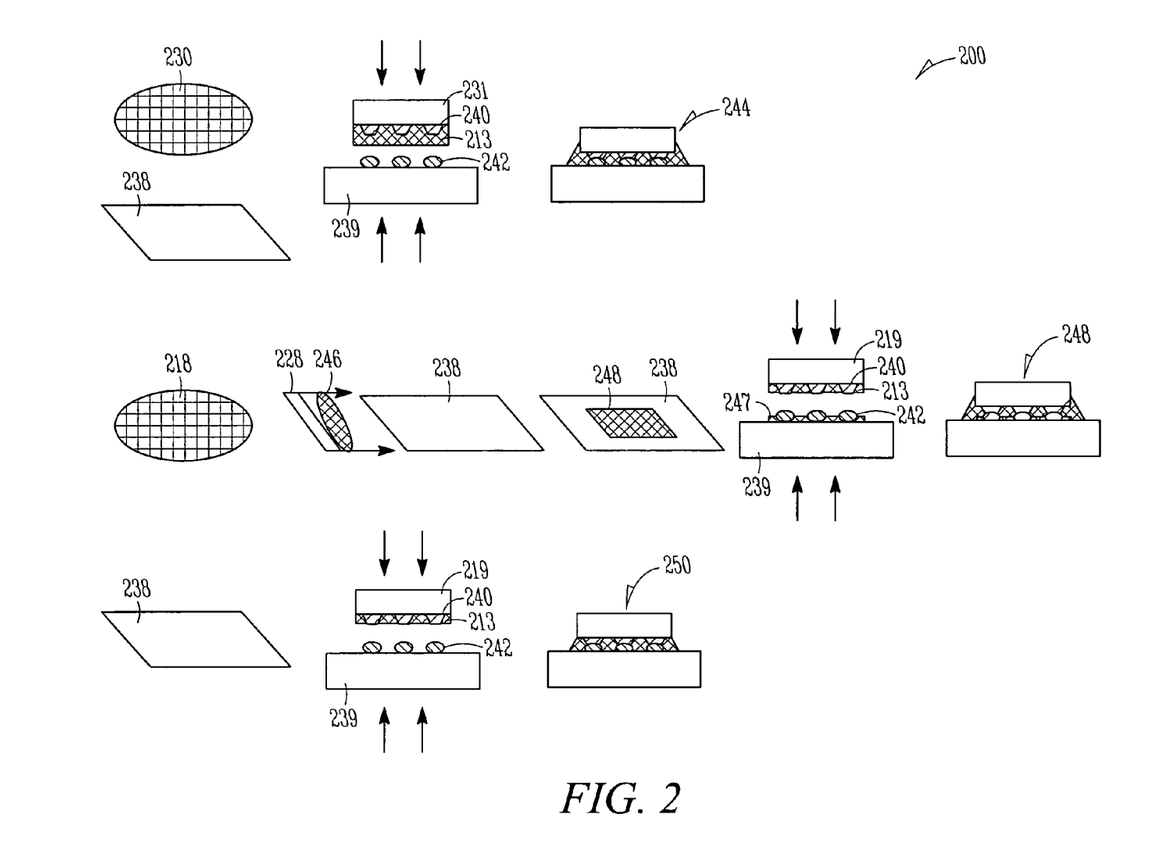
FIG. 2 is a schematic process flow diagram according to an embodiment.

FIG. 2 is a schematic process flow diagram 200 according to an embodiment. In an embodiment, a diced, coated wafer 230, such as the diced, coated wafer 130 in FIG. 1, is being disposed upon a bumped substrate 238. In an embodiment, the diced, coated wafer 230 has been singulated to achieve a semiconductive substrate 231 that is a die taken from the group of dice that made up the diced, coated wafer 230. Thereto are added a spin coating 213 or the like, and a die bond pad 240. The bumped substrate 238 is also depicted as a singulated mounting substrate 239 above the semiconductive substrate 231. The singulated mounting substrate 239 includes a plurality of mounting substrate bumps, one of which is depicted with reference numeral 242.

In an embodiment, an autogenous contacting method between the die bond pad 240 and the mounting substrate bump 242 is carried out by pressing the semiconductive substrate 231 and the mounting substrate 239 together as illustrated by the directional arrows. Thereby, the uncured spin-on coating 213 is penetrated by the mounting substrate bump 242 until contact thereby is made with the die bond pad 240. Accordingly, a flip-chip package 244 is achieved according to an embodiment.

In an embodiment, a diced, coated wafer 218, such as the bump-exposed, coated, etched wafer 118 in FIG. 1, is disposed upon a bumped substrate 238. In an embodiment, the bumped substrate 238 is prepared with a coating 246 that is any of the chip-packaging compositions set forth in this disclosure. The coating 246 is placed upon the bumped substrate 238 with a squeegee 228 for example, to achieve a bump-exposed field 248 on the bumped substrate 238.

The diced, coated wafer 218 is further depicted as part of a structure that includes a semiconductive substrate 219 that is a die taken from the group of dice that made up the diced, coated wafer 218. Further, the structure includes a spin-on coating 213 or the like, and a die bond pad 240. The bumped substrate 238 is also depicted as a singulated mounting substrate 239 above the semiconductive substrate 219. The singulated mounting substrate 239 includes a plurality of mounting substrate bumps, one of which is depicted with reference numeral 240. Further to the singulated mounting substrate 239 is depicted the singulated substrate coating 247.

In an embodiment, a method of joining is carried out between the die bond pad 240 and the mounting substrate bump 242 by pressing together the semiconductive substrate 219 and the singulated mounting substrate 239 as illustrated by the directional arrows. Accordingly, a flip-chip package 248 is achieved according to an embodiment.

In an embodiment, a diced, coated wafer 218, such as the bump-exposed, coated, etched wafer 118 in FIG. 1, is disposed upon a bumped substrate 238. The diced, coated wafer 218 is further depicted as part of a structure that includes a semiconductive substrate 219 that is a die taken from the group of dice that made up the diced, coated wafer 218. Further, the structure includes a spin-on coating 213 or the like, and a die bond pad 240. The bumped substrate 238 is also depicted as a singulated mounting substrate 239 above the semiconductive substrate 219. The singulated mounting substrate 239 includes a plurality of mounting substrate bumps, one of which is depicted with reference numeral 240.

In an embodiment, a method of joining is carried out between the die bond pad 240 and the mounting substrate bump 242 by pressing together the semiconductive substrate 219 and the singulated mounting substrate 239 as illustrated by the directional arrows. A flip-chip package 250 is achieved according to an embodiment.

Chip-Packaging Compositions

In an embodiment, the chip-packaging composition, whether it is an underfill composition or otherwise, includes a bis-maleimide and the solution, mixture, and reaction products of additives as set forth in this disclosure. In an embodiment, the chip-packaging composition includes a bis-maleimide, a diamine, and the solution, mixture, and reaction products with the additives as set forth in this disclosure. In an embodiment, the chip-packaging composition includes a bis-maleimide, an epoxy, and the solution, mixture, and reaction products with the additives as set forth in this disclosure. In an embodiment, the chip-packaging composition includes a bis-maleimide, a diamine, an epoxy, and the solution, mixture, and reaction products with the additives as set forth in this disclosure. In an embodiment, the chip-packaging composition includes a bis-maleimide, a diene, and the solution, mixture, and reaction products with the additives as set forth in this disclosure. In an embodiment, the chip-packaging composition includes a bis-maleimide, a diene, an amine, and the solution, mixture, and reaction products with the additives as set forth in this disclosure. In an embodiment, the chip-packaging composition includes a bis-maleimide, a diene, an epoxy, and the solution, mixture, and reaction products with the additives as set forth in this disclosure. In an embodiment, the chip-packaging composition includes a bis-maleimide, a diene, an amine, an epoxy, and the solution, mixture, and reaction products with the additives as set forth in this disclosure. Other chip-packaging composition embodiments include a bis-maleimide and other compositions such as hydroxides, aromatics, and the like.

Polymers of Bis-maleimides

Several chip-packaging composition types can be used in the chip-packaging compositions and in connection with at least one of the bis-maleimides as applied to any of the structures depicted in FIGS. 1-5. One suitable bis-maleimide is Matrimid® Part A from Huntsman Chemical of Salt Lake City, Utah. In an embodiment, a suitable bis-maleimide is synthesized from commercially available diamines and maleic anhydride. Bis-maleimides have the structure where the R group can be any number of structures.

In an embodiment, the chip-packaging composition starts with the base bis-maleimide monomer type

(1)

The R functional groups are independently selected from hydrogen, aromatics, substituted aromatics, aliphatics, substituted aliphatics, cyclo-aliphatics, and substituted cyclo-aliphatics. In an embodiment, the bis-maleimide monomer of this type is the monomer (1A)

that is used in connection with additives for polymerization. The chip-packaging composition embodiment includes this bis-maleimide and at least one of a chip and a mounting substrate that is in direct contact with the bis-maleimide as polymerized. In an embodiment, the bis-maleimide monomer of this type is the monomer (1B)

that is used in connection with additives for polymerization. The chip-packaging composition embodiment includes this bis-maleimide and at least one of a chip and a mounting substrate that is in direct contact with the bis-maleimide as polymerized.

In an embodiment, the chip-packaging composition starts with the base bis-maleimide monomer type (2)

The R functional groups are independently selected from hydrogen, aromatics, substituted aromatics, aliphatics, substituted aliphatics, cyclo-aliphatics, and substituted cyclo-aliphatics. In an embodiment, the attachment of the imides is para- instead of meta- as depicted. In an embodiment, the bis-maleimide monomer of this type is the monomer (2A)

that is used in connection with additives for polymerization. The chip-packaging composition embodiment includes this bis-maleimide and at least one of a chip and a mounting substrate that is in direct contact with the bis-maleimide as polymerized. In an embodiment, the attachment of the imides is para- instead of meta- as depicted. In an embodiment, either of the structures depicted in structures (2) and (2A) are configured as para-bis-maleimides.

In an embodiment, the chip-packaging composition starts with the base bis-maleimide monomer type (3)

The R functional groups are independently selected from hydrogen, aromatics, substituted aromatics, aliphatics, substituted aliphatics, cyclo-aliphatics, and substituted cyclo-aliphatics. In an embodiment, the bis-maleimide monomer of this type is the monomer (3A)

that is used in connection with additives for polymerization. The chip-packaging composition embodiment includes this bis-maleimide and at least one of a chip and a mounting substrate that is in direct contact with the bis-maleimide as polymerized. In an embodiment, either of the structures depicted in structures (3) and (3A) are configured as meta-bis-maleimides.

In an embodiment, the chip-packaging composition starts with the base bis-maleimide monomer type (4)

The R functional groups are independently selected from hydrogen, aromatics, substituted aromatics, aliphatics, substituted aliphatics, cyclo-aliphatics, and substituted cyclo-aliphatics. In an embodiment, the attachment of the imides is para- instead of meta- as depicted. In an embodiment, the structure depicted in structure (4) is configured as a para-bis-maleimide.

In an embodiment, the chip-packaging composition starts with the base para-bis-maleimide monomer type (5)

Unsubstituted positions can be substituted with R functional groups. The R functional groups are independently selected from hydrogen, aromatics, substituted aromatics, aliphatics, substituted aliphatics, cyclo-aliphatics, and substituted cyclo-aliphatics. In an embodiment, the structure depicted in structure (9) is configured as a meta-bis-maleimide. [put under 4]

In an embodiment, the chip-packaging composition starts with the base bis-maleimide monomer type

(6)

The R functional groups are independently selected from hydrogen, aromatics, substituted aromatics, aliphatics, substituted aliphatics, cyclo-aliphatics, and substituted cyclo-aliphatics. In an embodiment, the bis-maleimide monomer of this type is the monomer (6A)

that is used in connection with additives for polymerization. The chip-packaging composition embodiment includes this bis-maleimide and at least one of a chip and a mounting substrate that is in direct contact with the bis-maleimide as polymerized. In an embodiment, the bis-maleimide monomer of this type is the monomer (6B)

that is used in connection with additives for polymerization. The chip-packaging composition embodiment includes this bis-maleimide and at least one of a chip and a mounting substrate that is in direct contact with the bis-maleimide as polymerized.

In an embodiment, the chip-packaging composition starts with the base bis-maleimide monomer type (7)

The R functional groups are independently selected from hydrogen, aromatics, substituted aromatics, aliphatics, substituted aliphatics, cyclo-aliphatics, and substituted cyclo-aliphatics. The maleimide groups can be arranged in 1,2 or 1,3 substitution patterns.

In an embodiment, the chip-packaging composition starts with the base para-bis-maleimide monomer (8)

Unsubstituted positions can be substituted with R functional groups. The R functional groups are independently selected from hydrogen, aromatics, substituted aromatics, aliphatics, substituted aliphatics, cyclo-aliphatics, and substituted cyclo-aliphatics. In an embodiment, the structure depicted in structure (7) is configured in 1,2 or 1,3 substitution pattern.

In an embodiment, the chip-packaging composition starts with the base meta-bis-maleimide monomer (9)

Unsubstituted positions can be substituted with R functional groups. The R functional groups are independently selected from hydrogen, aromatics, substituted aromatics, aliphatics, substituted aliphatics, cyclo-aliphatics, and substituted cyclo-aliphatics. In an embodiment, the structure depicted in structure (9) is configured as a para-bis-maleimide.

In an embodiment, the chip-packaging composition starts with the base di-cyclo-bis-maleimide monomer type

(10)

Unsubstituted positions can be substituted with R functional groups. The R functional groups are independently selected from hydrogen, aromatics, substituted aromatics, aliphatics, substituted aliphatics, cyclo-aliphatics, and substituted cyclo-aliphatics.

Mixtures of Bis-maleimides with Diamines

Various diamines can be used in the chip-packaging composition embodiments. In an embodiment, the chip-packaging composition includes a bis-maleimide base monomer and a diamine thusly (11)

According to equation (11), the R1 and R2 functional groups are independently selected from aromatics, substituted aromatics, aliphatics, substituted aliphatics, cyclo-aliphatics, and substituted cyclo-aliphatics. One suitable diamine is Ethacure® 100 from Albermarle Corporation of Richmond, Va. Another suitable diamine is Ethacure® 300.

In an embodiment, the chip-packaging composition starts with the any of the bis-maleimide base monomers set forth in structures (1) through (10) along with the diamine (12)

that is used in connection with additives for polymerization. Specifically, the polymerization of the bis-maleimide base monomer set forth in structure (5A) and the diamine set forth in structure (12) can polymerise according to equation (13), thusly (13)

A chip-packaging composition embodiment includes this diamine and the bis-maleimide set forth in structure (12) and at least one of a chip and a mounting substrate that is in direct contact with the bis-maleimide and diamine set forth in equation (13) as polymerized.

In an embodiment, the chip-packaging composition starts with the any of the bis-maleimide base monomers set forth in structures (1) through (10) along with the diamine (14)

that is used in connection with additives for polymerization. A chip-packaging composition embodiment includes this diamine set forth in structure (14) along with a bis-maleimide and at least one of a chip and a mounting substrate that is in direct contact with the bis-maleimide and diamine after polymerization.

In an embodiment, the chip-packaging composition starts with the any of the bis-maleimide base monomers set forth in structures (1) through (10) along with the diamine (15)

that is used in connection with additives for polymerization. A chip-packaging composition embodiment includes this diamine set forth in structure (15) along with a bis-maleimide and at least one of a chip and a mounting substrate that is in direct contact with the bis-maleimide and diamine after polymerization.

In an embodiment, the chip-packaging composition starts with the any of the bis-maleimide base monomers set forth in structures (1) through (10) along with the diamine (16)

that is used in connection with additives for polymerization. A chip-packaging composition embodiment includes this diamine set forth in structure (16) along with a bis-maleimide and at least one of a chip and a mounting substrate that is in direct contact with the bis-maleimide and diamine after polymerization.

In an embodiment, the chip-packaging composition starts with the any of the bis-maleimide base monomers set forth in structures (1) through (10) along with the diamine (17)

that is used in connection with additives for polymerization. A chip-packaging composition embodiment includes this diamine set forth in structure (17) along with a bis-maleimide and at least one of a chip and a mounting substrate that is in direct contact with the bis-maleimide and diamine after polymerization.

In an embodiment, the chip-packaging composition starts with the any of the bis-maleimide base monomers set forth in structures (1) through (10) along with the diamine (18)

that is used in connection with additives for polymerization similar to the bis-maleimide and diamine polymerization illustrated in equation (13). The chip-packaging composition embodiment includes this diamine and any bis-maleimide set forth in structures (1) through (10) and at least one of a chip and a mounting substrate that is in direct contact with the bis-maleimide and diamine as polymerized. In an embodiment, the diamine set forth in structure (18) is replaced by a meta-diamine.

In an embodiment, the chip-packaging composition starts with the any of the bis-maleimide base monomers set forth in structures (1) through (10) along with the diamine (19)

that is used in connection with additives for polymerization similar to the bis-maleimide and diamine polymerization illustrate in equation (13). The chip-packaging composition embodiment includes this diamine and any bis-maleimide set forth in structures (1) through (10) and at least one of a chip and a mounting substrate that is in direct contact with the bis-maleimide and diamine as polymerized. In an embodiment, the diamine set forth in structure (19) is replaced by a para-diamine.

Various ratios of the bis-maleimides and diamines are useful embodiments. In an embodiment, where bis-maleimides and diamines are present without epoxies, the bis-maleimide is present in a range from about 99 percent to about 40 percent, and the diamine is present in a range from about 1 percent to about 60 percent. By these ranges, it is understood that additives may be present as set forth below, but the polymer composition is present in these ranges as a function as percentage of monomer starting constitutents. In an embodiment, the bis-maleimide is present in a range from about 90 percent to about 50 percent, and the diamine is present in a range from about 10 percent to about 50 percent. In an embodiment, the bis-maleimide is present in a range from about 80 percent to about 60 percent, and the diamine is present in a range from about 20 percent to about 40 percent. In an embodiment, the bis-maleimide is present in a range from about 70 percent to about 65 percent, and the diamine is present in a range from about 30 percent to about 35 percent.

Polymers of Bis-maleimides with Epoxies

In an embodiment, the bis-maleimide base monomer is combined with an epoxy and polymerized to a degree to form a bis-maleimide and epoxy polymer (BEP) as set forth in equation (20) thusly:

(20)

According to equation (20), the R1 and R3 functional groups are independently selected from aromatics, substituted aromatics, aliphatics, substituted aliphatics, cyclo-aliphatics, and substituted cyclo-aliphatics.

In an embodiment, the chip-packaging composition starts with the any of the bis-maleimide base monomers set forth in structures (1) through (10) along with the compound (21)

that is used in connection with additives for polymerization. A chip-packaging composition embodiment includes this diamine set forth in structure (21) along with a bis-maleimide and at least one of a chip and a mounting substrate that is in direct contact with the bis-maleimide and diamine after polymerization.

In an embodiment, the chip-packaging composition starts with the any of the bis-maleimide base monomers set forth in structures (1) through (10) along with the compound (22)

that is used in connection with additives for polymerization. A chip-packaging composition embodiment includes this compound set forth in structure (21) along with a bis-maleimide and at least one of a chip and a mounting substrate that is in direct contact with the bis-maleimide and compound after polymerization.

Various ratios of the bis-maleimides and epoxies are useful embodiments. In an embodiment, where bis-maleimides and epoxies are present without diamines, the bis-maleimide is present in a range from about 99 percent to about 40 percent, and the epoxy is present in a range from about 1 percent to about 60 percent. By these ranges, it is understood that additives may be present as set forth below, but the polymer composition is present in these ranges as a function as percentage of monomer starting constitutents. In an embodiment, the bis-maleimide is present in a range from about 90 percent to about 50 percent, and the epoxy is present in a range from about 10 percent to about 50 percent. In an embodiment, the bis-maleimide is present in a range from about 80 percent to about 60 percent, and the epoxy is present in a range from about 20 percent to about 40 percent. In an embodiment, the bis-maleimide is present in a range from about 70 percent to about 65 percent, and the epoxy is present in a range from about 30 percent to about 35 percent.

Mixtures of Bis-maleimides and Other Compounds

In an embodiment, the chip-packaging composition starts with the any of the bis-maleimide base monomers set forth in structures (1) through (10) along with the dihydroxy (23)

that is used in connection with additives for polymerization. A chip-packaging composition embodiment includes this dihydroxy set forth in structure (23) along with a bis-maleimide and at least one of a chip and a mounting substrate that is in direct contact with the bis-maleimide and dihydroxy after polymerization.

In an embodiment, the chip-packaging composition starts with the any of the bis-maleimide base monomers set forth in structures (1) through (10) along with the dihydroxy diene (24)

that is used in connection with additives for polymerization. A chip-packaging composition embodiment includes this dihydroxy set forth in structure (24) along with a bis-maleimide and at least one of a chip and a mounting substrate that is in direct contact with the bis-maleimide and dihydroxy after polymerization.

In an embodiment, the chip-packaging composition starts with the any of the bis-maleimide base monomers set forth in structures (1) through (10) along with the diene compound (25)

that is used in connection with additives for polymerization. A chip-packaging composition embodiment includes this compound set forth in structure (25) along with a bis-maleimide and at least one of a chip and a mounting substrate that is in direct contact with the bis-maleimide and diamine after polymerization.

Ternary Mixtures of Bis-maleimides, Diamines, and Epoxies

In an embodiment, the bis-maleimide base monomer is combined with a diamine and an epoxy and polymerized to a degree to form a bis-maleimide, diamine, and epoxy polymer. This ternary-mixture polymer is referred to as a cross-linked hybrid polymer (CHP) as set forth in equation (26) thusly:

(26)

According to equation (26), the R1, R2, and R3 functional groups are independently selected from aromatics, substituted aromatics, aliphatics, substituted aliphatics, cyclo-aliphatics, and substituted cyclo-aliphatics.

Various ratios of the bis-maleimides, diamines, and epoxies are useful embodiments. In an embodiment, the bis-maleimide starting material monomer is present as a majority composition constituent, and the diamine and the epoxy are present as minority constituents. In other words, the bis-maleimide starting material monomer is present as at least 50 percent, and the diamine and epoxy amount to the balance. In an embodiment, the diamine and epoxy are present in equal proportions. In an embodiment, the diamine is present in a smaller amount than the epoxy. In an embodiment, the diamine is present in a larger amount than the epoxy.

In an embodiment, the bis-maleimide is present as a plurality composition constituent, and the diamine and the epoxy are present as minority constituents. In other words, the bis-maleimide is present as the most prevalent of the three constituents. In an embodiment, the bis-maleimide is present in a plurality concentration range of up to 49 percent, and the diamine and epoxy amount to the balance. In an embodiment, the bis-maleimide is present in a plurality range from about 34 percent to about 49 percent, and the diamine and epoxy are present as the balance. By these ranges, it is understood that additives may be present as set forth below, but the polymer composition is present in these ranges as a percentage of monomer starting materials. In an embodiment, the bis-maleimide is present in a plurality concentration range from about 36 percent to about 45 percent, and the diamine and epoxy are present as the balance. In an embodiment, the bis-maleimide is present in a plurality concentration range from about 39 percent to about 42 percent, and the diamine and epoxy are present as the balance. For each of the bis-maleimide-plurality concentration embodiments, the diamine and epoxy balance can be present as equal amounts, or one more than the other as set forth above for the bis-maleimide-majority embodiments.

In a first example embodiment, an N,N'-Bis-maleimido-3,3'-dimethyl-bis(4-aminocyclohexylmethane) base monomer, about 15 g, was blended with Ethacure® 100 LC, about 6.7 g. Rheological analysis showed the mixture to have a wide process window, with a minimum viscosity of about 4.2 Poise at about 100° C.

The chip-packaging mixture was heated to about 165° C. in an aluminum pan. The chip-packaging mixture was then stirred and transferred to an oven for curing. Curing was carried out at about 180° C. for about 6 hours, followed by second curing at about 250° C. for about 2 hours. A dark red solid polymer was observed with an isotropic CTE of about 43 ppm/K. The Tg, above about 100° C. in any embodiment, was observed at about 132° C. to about 140° C. by thermo-mechanical analysis. The modulus was observed at about 4 GPa to about 5 GPa at about 25° C. and a peak of tan δ of about 133° C.

In a second example embodiment, the first example embodiment is repeated, but a particulate filler is added. A silica filler is added and the CTE decreases to about 40 ppm/K for the chip-packaging composite. In an embodiment, the silica filler is part of the chip-packaging composite to achieve a CTE of about 36 ppm/K. This CTE is useful to mate with some organic substrates.

In an embodiment, an inorganic particulate filler such as silica is part of the chip-packaging composite to achieve a CTE of about 30 ppm/K. This CTE is useful to mate with some inorganic substrates. In an embodiment, the silica filler is part of the chip-packaging composite to achieve a CTE of about 26 ppm/K. This CTE is useful to mate with some inorganic substrates and a semiconductive die. By the rule of mixtures and known and observed CTEs, an inorganic particulate filler such as silica is added and the CTE of the chip-packaging composite is lowered to about 20 ppm/K. This CTE is useful to mate with some semicondutive dice.

Quaternary Mixtures of Bis-maleimides, Diamines, Epoxies, Dienes, and Hydroxides In an embodiment, the bis-maleimide base monomer is combined with a diamine, an epoxy, and one of a diene and a hydroxide. The mixture is polymerized to a degree to form a bis-maleimide, diamine, epoxy, and one of a diene and hydroxide polymer. This quaternry-mixture polymer is referred to as a quaternary cross-linked hybrid polymer (QCHP) as set forth in equation (27) thusly:

(27)

According to equation (27), M represents one of a diene and a hydroxide that is polymerizable in the mixture. Similar to equation (26), the R1, R2, and R3 functional groups are independently selected from aromatics, substituted aromatics, aliphatics, substituted aliphatics, cyclo-aliphatics, and substituted cyclo-aliphatics. It is understood that the diene or hydroxide that is present also includes functional groups that are independently selected from aromatics, substituted aromatics, aliphatics, substituted aliphatics, cyclo-aliphatics, and substituted cyclo-aliphatics.

Various ratios of the bis-maleimides, diamines, epoxies, and one additional composition selected from a diene and a hydroxide, are useful embodiments. In an embodiment, the bis-maleimide starting material monomer is present as a majority composition constituent, the diamine, the epoxy, and one selected from the diene and the hydroxide are present as minority constituents. In other words, the bis-maleimide starting material monomer is present as at least 50 percent, and the diamine, the epoxy, and one selected from the diene and the hydroxide diamine. In an embodiment, the diamine, the epoxy, and one selected from the diene and the hydroxide are present in equal proportions. In an embodiment, the diamine is present in a larger amount than any of the epoxy, and one selected from the diene and the hydroxide, but the bis-maleimide remains the majority component. In an embodiment, the epoxy is present in a larger amount than any of the diamine, and one selected from the diene and the hydroxide, but the bis-maleimide remains the majority component. In an embodiment, the present diene or hydroxide is present in larger amount than any of the diamine and the epoxy, but the bis-maleimide remains the majority component.

In an embodiment, the bis-maleimide is present as a plurality composition constituent, and the diamine, the epoxy and one selected from the diene and the hydroxide are present as minority constituents. In other words, the bis-maleimide is present as the most prevalent of the four constituents. In an embodiment, the bis-maleimide is present in a plurality concentration range of up to 49 percent, and the diamine, epoxy, and one selected from the diene and the hydroxide amount to the balance. In an embodiment, the bis-maleimide is present in a plurality range from about 34 percent to about 49 percent, and the diamine, the epoxy, and one selected from the diene and the hydroxide are present as the balance. By these ranges, it is understood that additives may be present as set forth below, but the polymer composition is present in these ranges as a percentage of monomer starting materials. In an embodiment, the bis-maleimide is present in a plurality concentration range from about 36 percent to about 45 percent, and the diamine, the epoxy, and one selected from the diene and the hydroxide are present as the balance. In an embodiment, the bis-maleimide is present in a plurality concentration range from about 39 percent to about 42 percent, and the diamine, the epoxy, and one selected from the diene and the hydroxide are present as the balance. For each of the quaternary bis-maleimide-plurality concentration embodiments, the diamine, the epoxy, and one selected from the diene and the hydroxide balance can be present as equal amounts, or one more than the other as set forth above for the bis-maleimide-majority embodiments.

In an embodiment, the composition is present as a quintinary mixture with the bis-maleimide constituent holding a position as the majority constitutent as set forth above for any of the quaternary mixture embodiments. In an embodiment, the composition is present as a quintinary mixture with the bis-maleimide constituent holding a position as the plurality constitutent as set forth above for the quaternary mixture embodiments.

Additive Materials

In an embodiment, additive materials are included with the bis-maleimide containing chip-packaging compositions. The additive materials and the chip-packaging compositions constitute "chip-packaging mixtures" according to embodiments set forth herein.

Hardeners

In an embodiment, a hardener is added to assist in assuring sufficient stiffness to the chip-packaging composition for a given application. In an embodiment, any of the diamines set forth in this disclosure can be combined with any of the hardeners set forth in this section.

In an embodiment, a liquid primary aromatic diamine is used as a hardener. One example liquid primary aromatic diamine hardener is diethyldiaminotoluene (DETDA), which is marketed as ETHACURE® 100 from Albermarle. Another example liquid primary aromatic diamine hardener is a dithiomethyldiaminotoluene such as Ethacure® 300. Another example liquid primary aromatic diamine hardener is an alkylated methylenedianiline such as Lapox® K-450 manufactured by Royce International of Jericho, N.Y.

In an embodiment, a liquid hindered primary aliphatic amine is used as a hardener. One example liquid hindered primary aliphatic amine is an isophorone diamine. Another example liquid hindered primary aliphatic amine is an alkylated methylenedianiline such as Ancamine® 2049 manufactured by Pacific Anchor Chemical Corporation of Allentown, Pa.

In an embodiment, a liquid secondary aromatic amine is used as a hardener. One example liquid secondary aromatic amine embodiment is an N,N'-dialkylphenylene diamine such as Unilink® 4100 manufactured by DorfKetal of Stafford, Tex. Another example liquid secondary aromatic amine embodiment is an N,N'-dialkylmethylenedianilines: i.e. Unilink® 4200.

In an embodiment, a liquid secondary aliphatic amine is used as a hardener. One example liquid secondary aliphatic amine is an N,N'-dialkylmethylene-bis-(4-aminocyclohexane) such as Clearlink® 1000 manufactured by Dorf Ketal.

In an embodiment, a phenol is used as a hardener. One example phenol hardener is a bisphenol such as bisphenol A, bisphenol F, or bisphenol AP. Another example phenol hardener is a liquid novolac or cresol phenolic resin.

In an embodiment, an unsaturated compound is used as a hardener. One example unsaturated compound embodiment is a vinyl-substituted aromatic. Other example unsaturated compound embodiments are allyl-substuted aromatics and phenols such as Matrimid® B, manufactured by Huntsman Chemical of Salt Lake City, Utah, and TM124®, manufactured by Degussa of Parsippany, N.J. Other example unsaturated compound embodiments are 1-prop-2-enyl substituted aromatics and phenols such as TM123® manufactured by Degussa.

In an embodiment, an epoxy resin is used as a hardener. One example epoxy resin hardener embodiment includes glycidyl ethers of various bisphenols and chain extended versions thereof such as DER® 330, DER® 331, and DER® 354, manufactured by Dow Chemical of Midland, Mich. Examples of epoxy resin hardeners include modified bisphenol-based epoxy resins such as DER® 353, manufactured by Dow. Other example epoxy resin hardeners include biphenyl-based epoxies. Other example epoxy resin hardeners include naphthalene-based epoxies. Other example epoxy resin hardeners include novolac and cresol multifunctional resins such as DEN® 431, manufactured by Dow. Other example epoxy resin hardeners include cycloaliphatic epoxy resins. Other example epoxy resin hardeners include monofunctional, difunctional, and multifunctional epoxy compounds including those products employed as reactive diluents and modifiers. Specific examples thereof include aniline-based epoxies such as PEP® 6720, manufactured by Pacific Epoxy Polymers of Richmond, Va. Other example epoxy resins include modified epoxy resins such as carboxyl-terminated butadiene acrylonitrile adducts with epoxy compounds.

Any of the above hardeners may be employed alone or a mixture of several hardeners can be reacted with the bis-maleimide resins react to form cured crosslinked polymers at elevated temperature. The nature of such reaction is often complex and can include Michael addition to the maleimide bond, anionic polymerization across multiple maleimide bonds, Diels-Alder reactions, and ring-opening reactions. The cured chip-packaging compositions thus obtained have properties amenable to electronics packaging including high glass transition temperature and low CTE.

In a sample embodiment, Ethacure® 100, Unilink® 4100, 1,3-bis-maleimidobenzene (mPDABMI), and 4,4'-bis-maleimidodiphenylmethane were combined in specific stoichiometric and non-stoichiometric ratios and melt mixed in an aluminum pan. The formulation variables were the ratio of the two bis-maleimide components, the total amount of amine-hydrogen to maleimide double bonds, and the composition of the amine components. The homogeneous viscous liquids thus prepared were then cured at 175° C. for 2 hours using a 2° C./minute heat-up ramp. The samples thus prepared had a CTE in a range from about 50 ppm/K to about 60 ppm/K lower than those of epoxies. The samples all had glass transition temperatures greater than about 150° C.

Catalysts

In a embodiment, a catalyst is added to the bis-maleimide monomer in a ratio of catalyst to-monomer of about 0.01 parts per hundred chip-packaging composition (any inorganic particulates not accounted) to about 10 parts per hundred parts chip-packaging composition. In an embodiment, the cure property of the mixture with the catalyst includes reaching a gel time in less than about 90 seconds at the molding temperature. After curing the chip-packaging composition has a hot hardness of greater than about 70 (ShoreD).

In an example embodiment, a triarylphosphine is mixed into the chip-packaging composition in a range from about 0.01 to about 10 parts per hundred. The mixture is cured for about two minutes, and qualities are tested. In an example embodiment, a trialkylphosphine is mixed into the chip-packaging composition in a range from about 0.01 to about 10 parts per hundred. The mixture is cured for about two minutes, and qualities are tested.

In an example embodiment, a tetraphenylphosphine salt is mixed into the chip-packaging composition in a range from about 0.01 to about 10 parts per hundred. The mixture is cured for about two minutes, and qualities are tested.

In an example embodiment, a substituted imidazole is mixed into the chip-packaging composition in a range from about 0.01 to about 10 parts per hundred. The mixture is cured for about two minutes, and qualities are tested. In an example embodiment, an unsubstituted imidazole is mixed into the chip-packaging composition in a range from about 0.01 to about 10 parts per hundred. The mixture is cured for about two minutes, and qualities are tested.

In an example embodiment, an aryl-terteriary amine is mixed into the chip-packaging composition in a range from about 0.01 to about 10 parts per hundred. The mixture is cured for about two minutes, and qualities are tested. In an example embodiment, an alkyl-terteriary amine is mixed into the chip-packaging composition in a range from about 0.01 to about 10 parts per hundred. The mixture is cured for about two minutes, and qualities are tested.

In an example embodiment, a phenol is mixed into the chip-packaging composition in a range from about 0.01 to about 10 parts per hundred. The mixture is cured for about two minutes, and qualities are tested. In an example embodiment, a phenoxide is mixed into the chip-packaging composition in a range from about 0.01 to about 10 parts per hundred. The mixture is cured for about two minutes, and qualities are tested.

Fluxing Agents

In an embodiment, fluxing agents are added to assist in assuring quality electrical connections between the bumps and the bond pads during reflow. In an embodiment, a sulfonic acid-releasing fluxing agent is used. One fluxing agent type includes organic carboxylic acids and the like. Another fluxing agent type includes polymeric fluxing agents and the like. The examples of fluxing agents are any chemicals containing hydroxyl (—OH) group or carboxylic (—COOH) group or both, such as glycerin, ethylene glycol, tartaric acid, adipic acid, citric acid, malic acid, meilic acid, and glutaric acid. The fluxing agent is usable during processing at the temperature ranges set forth in this disclosure for the catalyst and/or hardener embodiments, as well as temperatures ranging between about 100° C. to about 300° C. In an embodiment the fluxing agent is provided in a range from about 1% to about 20% by weight of the total chip-packaging composition when it is prepared.

Elastomers

In an embodiment, one additive material is an elastomer for imparting flexibility to the chip-packaging composition. In an embodiment the elastomer is provided in a range from about 0.5% about 5% by weight of the total chip-packaging composition when it is prepared.

Reactive Diluents

Another additive material according to an embodiment is a reactive diluent. The specific reactive diluent that is employed will depend upon compatibility with the chip-packaging composition. Because of the bonding and sealing nature of the process embodiments, the reactive diluent can react with and dissolve into the final chip-packaging mixture before volatilizing, or it can both react and dissolve without being volatilized.

Reactive diluents for the above chip-packaging compositions according to embodiments include other low viscosity epoxy monomers such as Bi-phenyl epoxy, Bis-Phenol A epoxy, Bis-Phenol F epoxy, or the like. Other epoxies include phenyl glycidyl ethers, nonyl phenyl glycidyl ethers, p-butylphenyl glycidyl ethers, alkyl $C_8$-$C_{14}$ glycidyl ethers, cyclo aliphatic epoxies and the like. In an embodiment the reactive diluent is provided in a range from about 1% to about 10% by weight of the total chip-packaging composition when it is prepared.

Adhesion Promoters

Another additive material according to an embodiment is an adhesion promoter. The specific adhesion promoter that is employed depends upon compatibility with the given chip-packaging composition. Adhesion promoters that can be added to the above chip-packaging compositions include organic and inorganic combinations. In an embodiment, a silane coupling agent or the like is used as an adhesion promoter. In an embodiment, an organo-ziconate composition or the like is used as an adhesion promoter. In an embodiment, an organo-titanate composition or the like is used as an adhesion promoter. In an embodiment the adhesion promoter is provided in a range from about 0.1% to about 5% by weight of the total chip-packaging composition when it is prepared.

Flow Modifiers

Another additive material according to an embodiment is a flow modifier such as a surfactant. The specific flow modifier that is employed depends upon compatibility with the chip-packaging composition. The surfactant requires properties such as compatibility with the chip-packaging composition. In an embodiment, the surfactant is anionic such as long chain alkyl carboxylic acids, such as lauric acids, steric acids, and the like. In an embodiment, the surfactant is nonionic. Examples of nonionic surfactants are polyethylene oxides, poly propylene oxides, and the like. In an embodiment, the surfactant is cationic such as alkyl ammonium salts such as tert butyl ammonium chlorides, or hydroxides. In an embodiment the flow modifier is provided in a range from about 0.1% to about 1% by weight of the total chip-packaging composition when it is prepared.

Defoaming Agents

Another additive material according to an embodiment is a defoaming agent. The specific defoaming agent that is employed depends upon compatibility with the principal chip-packaging composition. In an embodiment the defoaming agent is provided in a range from about 0.1% to about 2% by weight of the total chip-packaging composition when it is prepared. Typical defoamers include silicones and acrylic polymers, i.e. Defoamer 45, Defoamer 455 (Dow), and various silicone oils.

Toughening Agents

Another additive material according to an embodiment is a toughening agent. A toughening agent causes the chip-packaging composition to resist crack propagation. In an embodiment, an elastomer is used as the toughening agent. The specific elastomer that is employed to toughen the matrix depends upon compatibility with the chip-packaging composition. For example, an elastomer that is used with bis-maleimides is carboxy-terminated polybutadiene-acrylonitrile (CTBN). CTBN is the generic name for a family of elastomer additives for epoxies, with the primary elastomer being functionalized butadine-acrylonitrile copolymer. These elastomers are available as epoxy, carboxy, amino and vinyl terminal functionalities. In an embodiment, rubber particles are used as toughening agents. The rubber particles can also be added as liquid and cured to become a toughening agent. Other elastomers may be used that are compatible with a given chip-packaging composition. In an embodiment the toughening agent is provided in a range from about 1% to about 10% by weight of the total chip-packaging composition when it is prepared.

Fillers

Another additive material according to an embodiment is an inorganic particulate filler. Inorganic particulate fillers that optionally are added to the chip-packaging mixtures include oxides of various elements such as silica, alumina, and others. Other inorganic particulate fillers include nitrides such as silicon nitride and the like. Other inorganic particulate fillers include conductive materials such as graphite, diamond, and the like. When an inorganic particulate filler is added, the chip-packaging mixture is more appropriately referred to as an "chip-packaging composite", in that it has inorganic particulate fillers as existing technology does, but it includes a chip-packaging composition according to various embodiments. The chip-packaging composite embodiments, unlike most other embodiments, include a multiple-phase substance. In an embodiment the inorganic particulate filler is provided in a range from about 1% to about 70% by weight of the total chip-packaging composite when it is prepared.

Radical Inhibitors

Another additive material includes at least one radical inhibitor. Radical inhibitors, such as butylatedhydroxystyrene (BHT) slows the polymerization of the bis-maleimides, and diamines and epoxies if present, and can be used to achieve selected properties, among which are toughness, CTE, moisture content, and others. In an embodiment, the degree of polymerization is in a range from about 10% to about 100%. Approximate 100% polymerization leads to a rigid polymer. In an embodiment, the degree of polymerization is in a range from about 20% to about 95%. Approximate 95% polymerization leads to a semi-rigid polymer. In an embodiment, the degree of polymerization is in a range from about 30% to about 90%. Approximate 90% polymerization leads to a semi-flexible polymer. In an embodiment, the degree of polymerization is in a range from about 40% to about 85%. Approximate 85% polymerization leads to a flexible polymer. In an embodiment, the degree of polymerization is in a range from about 50% to about 80%. Approximate 80% polymerization leads to a semi-deformable polymer. In an embodiment, the degree of polymerization is in a range from about 60% to about 75%. Approximate 75% polymerization leads to a deformable polymer.

Figure 3:
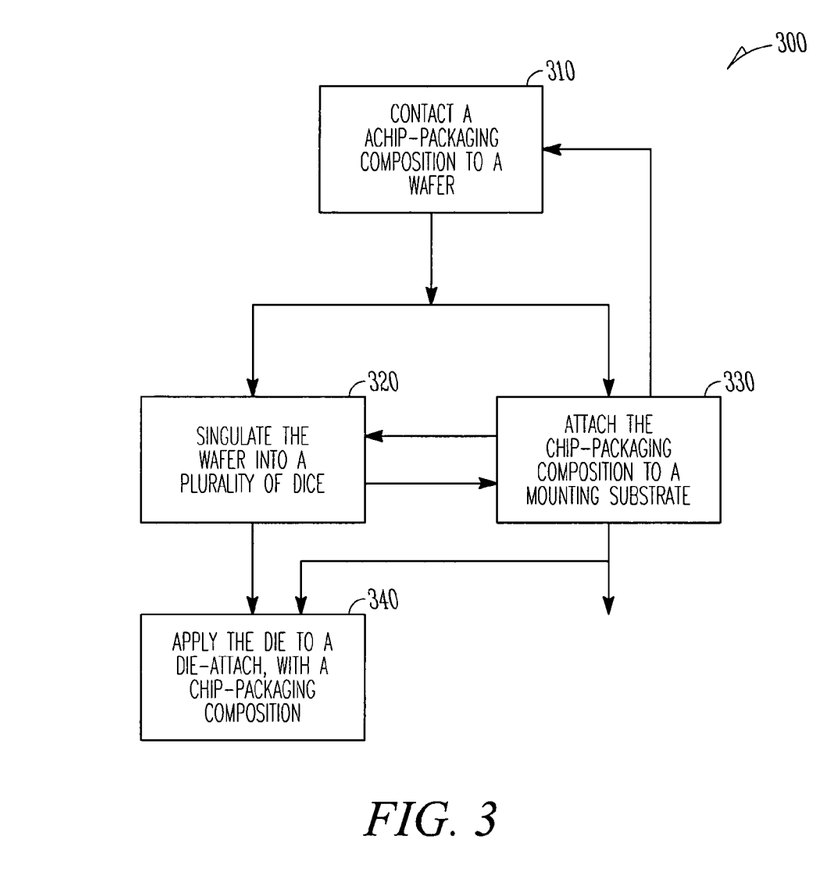
FIG. 3 is a process flow diagram according to an embodiment.

FIG. 3 is a process flow diagram 300 according to an embodiment.

At 310, the process includes contacting a bis-maleimide chip-packaging composition with a wafer.

At 320, the process includes singulating the wafer. In an embodiment, singulating the wafer is either preceded or followed by curing of the bis-maleimide chip-packaging composition to form a cured chip-packaging composition.

At 330, the process includes attaching the chip-packaging composition to a mounting substrate. In an embodiment, the process commences at 330, flows back to 310, and may proceed further to 320. In an embodiment, singulating the wafer is either preceded or followed by curing of the bis-maleimide chip-packaging composition to form a cured chip-packaging composition.

At 340, the process includes applying the die to a die-attach with a bis-maleimide chip-packaging composition.

Figure 4:
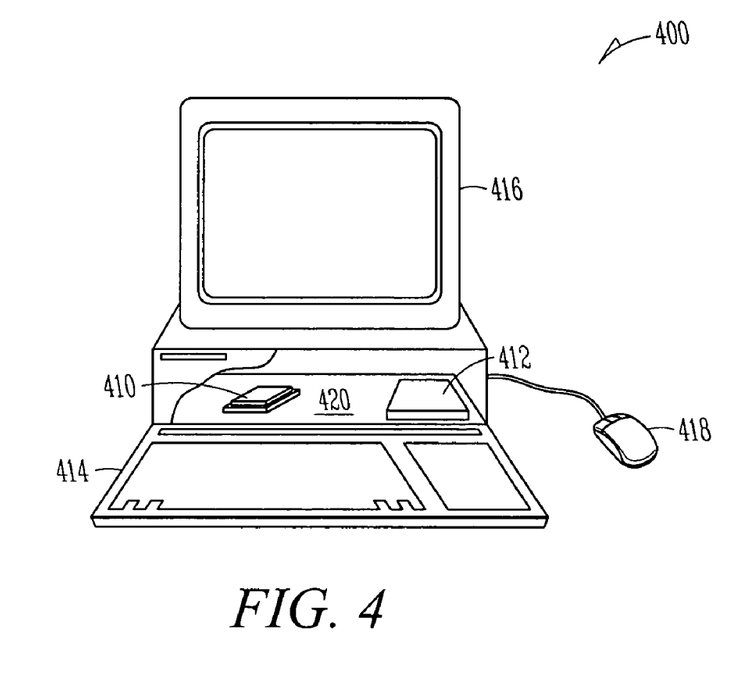
FIG. 4 is a depiction of a computing system according to an embodiment.

FIG. 4 is a depiction of a computing system 400 that is manufactured according to an embodiment. One or more of the foregoing embodiments of the bis-maleimides along with the diamines or the epoxies, whether as chip-packaging compositions, chip-packaging mixtures, or chip-packaging composites, may be utilized in a computing system, such as a computing system 400 of FIG. 4. The computing system 400 includes at least one processor (not pictured), which is enclosed in a package 410, a data storage system 412, at least one input device such as keyboard 414, and at least one output device such as monitor 416, for example. In an embodiment the data storage system 412 is dynamic random-access memory. The computing system 400 includes a processor that processes data signals, and may include, for example, a microprocessor, available from Intel Corporation. In addition to the keyboard 414, the computing system 400 can include another user input device such as a mouse 418, for example.

For purposes of this disclosure, a computing system 400 embodying components in accordance with the claimed subject matter may include any system that utilizes at least one of the bis-maleimides along with the diamines or the epoxies, which may be coupled to a mounting substrate 420, for example, for a data storage device such as dynamic random access memory, polymer memory, flash memory, and phase-change memory. The chip-packaging composition that includes at least bis-maleimides along with the diamines, the oxides, or the epoxies can also be coupled to a mounting substrate 420 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the chip-packaging composition that includes at least bis-maleimides along with the diamines, the oxides, or the epoxies, and it can be placed in a portable device such as a wireless communicator or a hand-held device such as a personal digital assistant and the like. Another example is a die that can be packaged with a chip-packaging composition and at least bis-maleimides along with the diamines or the epoxies, and placed in a vehicle such as an automobile, a locomotive, a watercraft, an aircraft, or a spacecraft.

Figure 5:
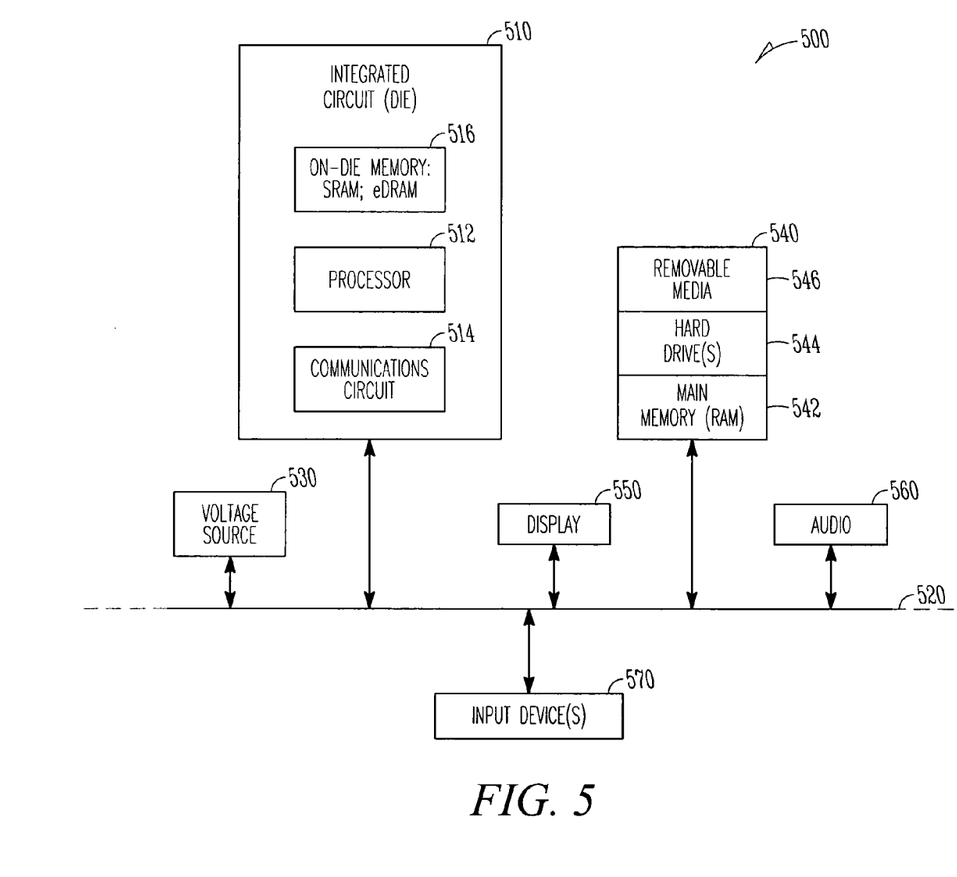
FIG. 5 is a schematic of an electronic system according to an embodiment.

FIG. 5 is a schematic of an electronic system 500 according to an embodiment. The electronic system 500 as depicted can embody the computing system 400 depicted in FIG. 4, but the electronic system is depicted more generically. The electronic system 500 incorporates at least one electronic assembly 244, 248, or 250, such as an IC die illustrated in FIG. 2. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 means any type of circuit such as, but not limited to, a microprocessor, a microcontroller, a graphics processor, a digital signal processor, or another processor. Other types of circuits that can be included in the integrated circuit 510 are a custom circuit or an ASIC, such as a communications circuit 514 for use in wireless devices such as cellular telephones, pagers, portable computers, two-way radios, and similar electronic systems. In an embodiment, the processor 510 includes on-die memory 516 such as SRAM. In an embodiment, the processor 510 includes on-die memory 516 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital video disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, integrated circuit 510 can be implemented in a number of different embodiments, including an electronic package, an electronic system, a computer system, one or more methods of fabricating an integrated circuit, and one or more methods of fabricating an electronic assembly that includes the integrated circuit and the bis-maleimide chip packaging composition as set forth herein in the various embodiments and their art-recognized equivalents. The elements, materials, geometries, dimensions, and sequence of operations can all be varied to suit particular packaging requirements.

The Abstract is provided to comply with 37 C.F.R. § 1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
    applying a chip-packaging composition to a wafer, wherein the chip-packaging composition includes:
        a bis-maleimide; and
        at least one of a diamine, an epoxy, an aromatic, a hydroxide, and the solution, reaction, and mixture products of the bis-maleimide and the at least one of the diamine, the epoxy, the aromatic, and the hydroxide; and
    curing the chip-packaging composition.

2. The process of claim 1, further including singulating the wafer into a plurality of dice.

3. The process of claim 2, wherein curing the chip-packaging composition precedes singulating the wafer into a plurality of dice.

4. The process of claim 2, further including:
    applying a die singulated from the wafer to a mounting substrate, followed thereafter by said curing the chip-packaging composition.

5. The process of claim 4, wherein curing the chip-packaging composition is carried out in a temperature range from about 100° C. to about 300° C.

6. The process of claim 4, wherein curing the chip-packaging composition is carried out in a time range from about 1 hour to about 12 hours.

7. The process of claim 4, wherein curing the chip-packaging composition is carried out in a temperature range from about 100° C. to about 300° C., and in a time range from about 1 hour to about 12 hours.

8. The process of claim 2, further including:
    applying a die singulated from the wafer to a mounting substrate, followed thereafter by said curing the chip-packaging composition;
    wherein the mounting substrate is a bumped mounting substrate, and wherein applying the die to a mounting substrate includes penetrating the chip-packaging composition with the bumped mounting substrate.

9. The process of claim 2, further including:
    exposing a die bond pad from a die singulated from the wafer, through the chip-packaging composition, wherein exposing is selected from etching and polishing; and
    applying the die from the wafer to a mounting substrate, wherein the mounting substrate is a bumped mounting substrate.

10. The process of claim 2, further including:
    applying a bis-maleimide containing chip-packaging composition to a bumped mounting substrate; and
    applying the die from the wafer to the bumped mounting substrate.

11. A process of forming a chip package comprising:
    applying a chip-packaging composition to a wafer, the chip-packaging composition including a bis-maleimide and at least one of a diamine, an epoxy, an aromatic, a hydroxide, and the solution, reaction, and mixture products of the bis-maleimide and the at least one of the diamine, the epoxy, the aromatic, and the hydroxide, and wherein applying the chip-packaging composition includes applying the chip-packaging composition, selected as an underfill material, an over-molded underfill material, as an encapsulant, as a molding compound, as a die-attach adhesive, as a thermal interface material, and combinations thereof; and
    curing the chip-packaging composition.

12. The process of claim 11, wherein curing the chip-packaging composition is carried out in a temperature range from about 100° C. to about 300° C.

13. The process of claim 11, wherein curing the chip-packaging composition is carried out in a time range from about 1 hour to about 12 hours.

14. The process of claim 11, wherein curing the chip-packaging composition is carried out in a temperature range from about 100° C. to about 300° C., and in a time range from about 1 hour to about 12 hours.

15. The process of claim 11, wherein the bis-maleimide is about 15 parts N,N'-Bis-maleimido-3,3'-dimethyl-bis(4-aminocyclohexylmethane) base monomer, wherein the diamine is about 6.7 parts Ethacure® 100 LC, wherein curing includes first heating the chip-packaging mixture to about 160° C., first curing at about 180° C. for about 6 hours, and second curing the chip-packaging mixture at about 250° C. for about 2 hours.

16. The process of claim 11, wherein before applying, the bis-maleimide and the diamine are combined according to the expression and wherein R1 and R2 are independently selected from aromatics, substituted aromatics, aliphatics, substituted aliphatics, cyclo-aliphatics, substituted cyclo-aliphatics, and combinations thereof.

17. The process of claim 11, wherein before applying, wherein the bis-maleimide and the epoxy are combined according to the expression wherein BEP is a bis-maleimide and epoxy polymer, and wherein R1 and R3 are independently selected from aromatics, substituted aromatics, aliphatics, substituted aliphatics, cyclo-aliphatics, substituted cyclo-aliphatics, and combinations thereof.

18. The process of claim 11, wherein before applying, wherein the chip-packaging composition is prepared according to wherein CHP is a cross-linked hybrid polymer, and wherein R1, R2, and R3 are independently selected from aromatics, substituted aromatics, aliphatics, substituted aliphatics, cyclo-aliphatics, substituted cyclo-aliphatics, and combinations thereof.

19. The process of claim 11, wherein before applying, wherein the chip-packaging composition is prepared with the bis-maleimide present in a majority amount.

20. The process of claim 11, wherein before applying, wherein the chip-packaging composition is prepared with the bis-maleimide present in a plurality amount, and wherein the diamine is present in an amount greater than the epoxy.

21. The process of claim 11, wherein before applying, wherein the chip-packaging composition is prepared with the bis-maleimide present in a plurality amount, and wherein the diamine is present in an amount less than the epoxy.

22. The process of claim 11, wherein before applying, wherein the chip-packaging composition is prepared with a hardener.

23. The process of claim 11, wherein before applying, wherein the chip-packaging composition is prepared with a particulate filler.

24. A process comprising:
   applying a chip-packaging composition to a wafer, wherein the chip-packaging composition includes:
      a bis-maleimide; and
      at least one of a diamine, an epoxy, an aromatic, a hydroxide, and the solution, reaction, and mixture products of the bis-maleimide and the at least one of the diamine, the epoxy, the aromatic, and the hydroxide;
   curing the chip-packaging composition;
   singulating the wafer into a plurality of dice; and
   wherein applying the chip-packaging composition further includes applying the chip-packaging composition, selected as an underfill material, as an over-molded underfill material, as an encapsulant, as a molding compound, as a die-attach adhesive, as a thermal interface material, and combinations thereof.

25. The process of claim 24, further including:
   inserting one of the plurality of dice into a computing system, the computing system including:
      a mounting substrate, wherein the die is coupled to the mounting substrate; and
      dynamic random-access memory coupled to the one of the plurality of dice.

26. The process of claim 25, further including inserting the one of the plurality of dice into one of a computer, a wireless communicator, a hand-held device, an automobile, a locomotive, an aircraft, a watercraft, and a spacecraft.

* * * * *